(12) United States Patent
Freimann et al.

(10) Patent No.: US 9,377,694 B2
(45) Date of Patent: Jun. 28, 2016

(54) PROJECTION ARRANGEMENT

(71) Applicant: Carl Zeiss SMT GmbH, Oberkochen (DE)

(72) Inventors: Rolf Freimann, Aalen (DE); Boris Bittner, Roth (DE)

(73) Assignee: Carl Zeiss SMT GmbH, Oberkochen (DE)

(*) Notice: Subject to any disclaimer, the term of this patent is extended or adjusted under 35 U.S.C. 154(b) by 159 days.

(21) Appl. No.: 14/086,393

(22) Filed: Nov. 21, 2013

(65) Prior Publication Data

US 2014/0104587 A1  Apr. 17, 2014

Related U.S. Application Data

(63) Continuation of application No. PCT/EP2012/061718, filed on Jun. 19, 2012.

(60) Provisional application No. 61/498,681, filed on Jun. 20, 2011.

(30) Foreign Application Priority Data

Jun. 20, 2011 (DE) .......... 10 2011 077 784

(51) Int. Cl.
G03B 27/54 (2006.01)
G03F 7/20 (2006.01)

(52) U.S. Cl.
CPC .......... G03F 7/7015 (2013.01); G03F 7/70266 (2013.01); G03F 7/70308 (2013.01); G03F 7/70891 (2013.01)

(58) Field of Classification Search
CPC .............. G03F 7/7015; G03F 7/70266; G03F 7/70308; G03F 7/70891; G03F 7/708
USPC .......................................................... 355/67
See application file for complete search history.

(56) References Cited

U.S. PATENT DOCUMENTS 6,521,877 B1    2/2003  Mueller-Rissmann et al.
7,375,794 B2 *  5/2008  Box .................. G03F 7/708
                                                    355/53

(Continued)

FOREIGN PATENT DOCUMENTS

CN    102020271 A     4/2011
DE    199 56 353 C1   8/2001

(Continued)

OTHER PUBLICATIONS

International Search Report and a Written Opinion from the counterpart PCT Application No. PCT/EP2012/061718, dated Oct. 5, 2012.

(Continued)

*Primary Examiner* — Peter B Kim
(74) *Attorney, Agent, or Firm* — Fish & Richardson P.C.

(57) ABSTRACT

A projection arrangement for imaging lithographic structure information comprises: an optical element, which has at least partly a coating composed of an electrically conductive layer material. The coating comprises a continuous region, which has no elements that shade projection light. In this case, the layer material and/or the optical element change(s) an optical property, in particular a refractive index or an optical path length, depending on a temperature change. At least one mechanism for coupling energy into the layer material is provided, which couples in energy in such a way that the layer material converts coupled-in energy into thermal energy. The layer material may comprise graphene, chromium and/or molybdenum sulfide ($MoS_2$).

33 Claims, 13 Drawing Sheets

(56) References Cited

U.S. PATENT DOCUMENTS

| | | | |
|---|---|---|---|
| 7,525,640 B2 | 4/2009 | Jansen et al. | |
| 7,723,684 B1 | 5/2010 | Haddon et al. | |
| 2008/0024746 A1 | 1/2008 | Mann | |
| 2008/0123066 A1 | 5/2008 | Hendricus Jensen et al. | |
| 2008/0174858 A1 | 7/2008 | Feldmann et al. | |
| 2009/0046260 A1* | 2/2009 | Jansen | G03F 7/70533 355/30 |
| 2009/0257032 A1 | 10/2009 | Eva et al. | |
| 2010/0201958 A1 | 8/2010 | Hauf et al. | |
| 2011/0070146 A1 | 3/2011 | Song et al. | |

FOREIGN PATENT DOCUMENTS

| | | |
|---|---|---|
| DE | 10 2008 000 968 | 10/2008 |
| EP | 1 881 520 | 1/2008 |
| EP | 1 921 505 | 5/2008 |
| JP | 2001-185483 A | 7/2001 |
| JP | 2008-118135 A | 5/2008 |
| JP | 2011-063506 A | 3/2011 |
| WO | WO 2007/033964 | 3/2007 |
| WO | WO 2008/122410 | 10/2008 |

OTHER PUBLICATIONS

German Office Action, with translation thereof, for corresponding DE 10 2011 077 784.9, dated Feb. 29, 2012.

Chinese Office Action with English translation thereof for corresponding Appln. No. 201280030365.8, 18 pages, dated Aug. 13, 2015.

Korean Office Action, with translation thereof, for corresponding KR Appl No. 2014-7001057, dated Nov. 26, 2015.

Japanese Office Action, with translation thereof, for corresponding JP Appl No. 2014-516308, dated Nov. 24, 2015.

Chinese Office Action, with translation thereof, for corresponding CN Appl No. 201280030365.8, dated Mar. 4, 2016.

* cited by examiner

PROJECTION ARRANGEMENT

CROSS-REFERENCE TO RELATED APPLICATIONS

The present invention relates to a projection arrangement, such as, for example, for imaging lithographic structures. The present application is a continuation of, and claims benefit under 35 USC 120 to, international application PCT/EP2012/061718, filed Jun. 19, 2012, which claims benefit under 35 USC 119 of German Application No. 10 2011 077 784.9, filed Jun. 20, 2011. International application PCT/EP2012/061718 also claims priority under 35 USC 119(e) to U.S. Provisional Application No. 61/498,681, filed Jun. 20, 2011. The entire disclosure of international application PCT/EP2012/061718 is incorporated by reference herein.

The present invention relates to a projection arrangement, such as, for example, for imaging lithographic structures. This application claims priority to the German Patent Application No. 10 2011 077 784.9 filed on Jun. 20, 2011. The entire disclosure of this patent application is incorporated into the present application by reference.

The industrial fabrication of integrated electrical circuits and also other micro- or nanostructured components is generally effected via lithographic methods. In this case, a plurality of patterned layers are applied to a suitable substrate, for example a semiconductor wafer. For patterning the layers, the latter are firstly covered with a photoresist that is sensitive to radiation in a specific wavelength range. It is expedient to use light having as short a wavelength as possible for the exposure, since the lateral resolution of the structures to be produced is directly dependent on the wavelength of the light. At the present time, particularly light or radiation in the deep ultraviolet (DUV: deep ultraviolet, VUV: vacuum ultraviolet) or in the far, extreme ultraviolet spectral range is used. This is also referred to as EUV=extreme ultraviolet.

Customary light wavelengths for DUV or VUV systems are currently 248 nm, 193 nm and occasionally 157 nm. In order to obtain even higher lithographic resolutions, radiation through to soft X-ray radiation (EUV) having a wavelength of a few nanometers is used. For light having the wavelength of 13.5 nm, it is possible to manufacture, for example, radiation sources and optical units for lithographic purposes.

The corresponding wafer coated with photoresist is therefore exposed by an exposure apparatus. In this case, a pattern of structures that is produced on a mask or a reticle is imaged onto the photoresist with the aid of a projection lens. Since the EUV radiation is greatly absorbed by matter, reflective optical units and masks are increasingly being used. Refractive optical units are usually used for radiation to approximately 193 nm.

After the photoresist has been developed, the wafer is subjected to chemical processes, as a result of which the surface of the wafer is patterned according to the pattern on the mask. The residual photoresist that has not been processed is then rinsed away from the remaining parts of the layer. Further known methods for semiconductor fabrication or processing, such as doping, etc., can follow. This process is repeated until all layers have been applied to the wafer for forming the semiconductor structure.

During the imaging of the lithographic micro- or nano-structures onto the wafer surface, usually it is not the entire wafer that is exposed, but rather only a narrow region. The wafer surfaces are generally exposed piece by piece or slot by slot. In this case, both the wafer and the reticle or the mask are scanned step by step and moved antiparallel relative to one another. In this case, the exposure area is often a rectangular region.

It is possible for imaging aberrations to arise as a result of absorption of the projection light in the lens elements or mirrors forming the optical system. Light-induced effects, such as non-uniform heating, can lead to local alteration of optical properties of the lens elements or mirrors. In order that, in particular, microlithographic structures can be imaged onto wafers as flawlessly as possible, mechanisms for compensating for such imaging aberrations are desired.

By way of example, EP 1 921 505 proposed applying, in the vicinity of pupil planes, heating wires to the surfaces of optical elements, which are individually drivable. WO 2007/0 333 964 A1 proposes an adaptive optical element in the manner of a mirror having, below the reflection layer, a correction layer that can be thermally manipulated.

It would be desirable, however, to have measures which, particularly in transmitted-light operation, make it possible to compensate for imaging aberrations induced by projection light, and accomplish this preferably without causing shading.

Therefore, it is an object of the present invention to provide an improved projection arrangement.

This object is achieved via a projection arrangement for imaging lithographic structure information comprising:
an optical element, which has at least partly a coating composed of an electrically conductive layer material, wherein the coating comprises a continuous region, which has no elements that shade projection light, and the layer material and/or the optical element change(s) an optical property, in particular a refractive index or an optical path length, depending on a temperature change; and
at least one mechanism for coupling energy into the layer material in such a way that the layer material converts coupled-in energy into thermal energy, wherein the layer material is selected from the group consisting of graphene, chromium and molybdenum sulfide ($MoS_2$).

Accordingly, a projection arrangement for imaging lithographic structure information is proposed, which comprises: an optical element, which has at least partly a coating composed of an electrically conductive layer material, wherein the coating comprises a continuous region, which has no elements that shade projection light, and the layer material and/or the optical element change(s) an optical property, in particular a refractive index or an optical path length, depending on a temperature change. The projection arrangement further comprises at least one mechanism for coupling energy into the layer material in such a way that the layer material converts coupled-in energy into thermal energy.

The layer material is, for example, selected from the group consisting of graphene, chromium and molybdenum sulfide ($MoS_2$).

The optical element provided with a coating can act in the manner of a wavefront manipulator and makes possible, particularly within the continuous region, a local change in the optical properties. The optical element can be inserted into an optical system for example in proximity to the field. Shading in the beam path of the projection arrangement by structures on the optical element preferably does not occur. The imaging of the lithographic structure information is therefore not disturbed by the coating even in transmitted-light operation. Since the layer material converts coupled-in energy, in particular into thermal energy, the coupling-in mechanism makes possible, in particular, a targeted and manipulated energy or heat distribution in the continuous region which is covered by the layer material. The projection arrangement therefore comprises a precisely locally drivable heating layer that is transparent to the projection light.

Electrically conductive material can be excited in a cost-effective manner and consequently generate heat locally in a targeted manner. The coating is arranged in the beam path of the projection arrangement, but does not lead to diffraction or shading, as occurs for example in the case of heating wire grids of conventional approaches.

It is furthermore possible to cover parts of the optical element from a plurality of continuous regions. Since the layer material is substantially transparent, no shading arises at the interfaces between coated regions.

In one embodiment, the coupling-in mea mechanism ns is arranged laterally outside the continuous region. The lateral coupling-in mechanism preferably provided outside the beam path makes it possible to manipulate, in particular, lens elements or plane plates in a targeted manner with regard to their temperature distribution. The projection arrangement thus provides a particularly good imaging property, since light-induced effects can be compensated for.

In other embodiments, the optical element is arranged in proximity to the field. In contrast to conventional wavefront manipulators, which usually have to be provided in proximity to the pupil, since shading elements are present, the proposed projection arrangement allows positioning in proximity to the field. This is the case, in particular, because the coating material has preferably no or only slight absorption of the light used. In this respect, it is possible to provide the optical element with the coating in the continuous region in the vicinity of an image plane or intermediate image plane. In particular, an optical element can also be used for retrofitting an existing projection arrangement. Consequently, a universally usable wavefront manipulator arises.

In the case of the projection arrangement, the continuous region preferably has no elements that shade projection light. Conventional conductor arrangements at or on optical elements can lead to diffraction patterns or are concomitantly imaged in a disturbing manner particularly during use in an image plane.

In one embodiment of the projection arrangement, the layer material is arranged homogeneously in the continuous region on a surface of the optical element. The layer material can, for example, be applied by vapor deposition or be applied already in the manner of a film onto the surface of the optical element. Materials are known, in particular, which comprise only a few atomic monolayers and can be applied, for example, to mirrors or lens element surfaces.

In another embodiment, the optical element is configured in such a way that the coating is present between two outer surfaces. By way of example, the coating can also be provided as one of a plurality of intermediate layers between plane plates.

The layer material preferably has a linear electrical resistance. In the case of a linear electrical resistance, the heat manipulation by coupled-in electrical energy can be established particularly cost-effectively and in a precisely localized manner.

In the case of the projection arrangement, the layer material preferably comprises graphene, chromium and/or molybdenum sulfide. The materials mentioned have suitable transparences to projection light used in microlithography.

Preferably, the absorption at wavelengths of 248 nm or 193 nm is not more than 10%. Absorptances at the wavelengths for projection light of less than 5% are particularly preferred.

It is also conceivable to use a reflective optical element, wherein the layer material can also be non-transparent to the radiation to be reflected.

The materials mentioned, in particular graphene, can be applied homogeneously over continuous geometrical regions. In the case of metals as layer materials, it is additionally possible to couple in energy in a simple manner for example by electrical transport via contacts or else by irradiation by microwaves, for example.

In one embodiment, the layer material exclusively comprises single- and/or multilayered graphene. Graphene is sufficiently transparent and electrically conductive at wavelength ranges of 193 nm. Furthermore, graphene is a particularly smooth material exhibiting roughness values of only a few nanometers. Particularly a coating with graphene can comprise, for example, thicknesses of between 0.3 nm and 25 nm. In this case, the transparency is preferably above 80%. Particularly preferably, the coating is in the manner of a graphene monolayer. It is thereby possible to obtain transparencies of above 95% and particularly preferably above 97% in the case of projection light for lithographic applications.

The layer material can furthermore comprise doped conductive graphene. The doping can be effected as n- type or p-type dopings. A corresponding transparent coating by graphene mono- or multilayers has a good electrical conductivity, such that evolution of heat as a result of electrical or electromagnetic energy being coupled in leads to a targeted and localized temperature development in the continuous region on or in the optical element. A targeted and expedient manipulation of the wavefronts can thus be achieved. A graphene heating layer can also be mentioned as coating.

It is conceivable for the graphene to be produced with the aid of chemical vapor deposition.

In one embodiment of the projection arrangement, the coating has grooves. Particularly in the case of multilayered graphene coatings, it is possible to provide grooves or fissures. In one embodiment, the grooves or fissures have a smaller lateral extent than the wavelength of the projection light used. The grooves have, for example, a smaller width than the wavelength. As a result, no disturbance occurs optically as a result of the grooves or fissures. On the other hand, it is possible to define regions within the continuous region via the grooves or fissures. In this respect, a temperature development can be effected with more targeted localization.

The electrical properties change in the region of the fissures since, for example, the graphite layer thickness is reduced. In this respect, an increased electrical resistance arises there. Such grooves or fissures are also designated as sub-lambda indentations, wherein lambda ($\lambda$) denotes the wavelength of the projection light. By way of example, groove widths of 100 nm down to one or a few graphene monolayers are possible. Such sub-lambda grooves make possible a particularly targeted alteration of the temperature of the coating or of the regions of the optical element for compensating for imaging aberrations.

In one embodiment, the coupling-in mechanism is embodied as electrical contacts at the edge of the continuous region with a plurality of electrodes. By way of example, it is possible to produce metal electrodes running in circular or ring-shaped fashion around the continuous region with the coating. In principle, two electrodes suffice in order to inject an electric current along the coating material. The coating material is heated by the electrical resistance by which the electrical energy is converted into thermal energy. As a result, by way of example, the respective medium adjacent to the graphene is heated and obtains altered optical properties, such as an altered refractive index or a different optical path length.

Electrical contacts can be produced comparatively cost-effectively and can be applied, for example, by vapor deposition or by adhesive bonding. In this case, the electrodes can be laterally in electrical contact with the coating.

It is also possible to equip the projection arrangement with a mechanism for coupling in for magnetic energy. By way of example, the coupling-in mechanism means can comprise a coil arrangement. A coil arrangement induces eddy currents in the coating for example in the manner of an induction hob, as a result of which heat can be generated in turn. One advantage of induced currents in the layer material or of induction heating is that the coupling-in mechanism can be used outside the beam path of the projection arrangement and have no direct contact with the layer material.

It is furthermore possible to introduce electromagnetic radiation, such as microwaves, by a suitable coupling-in mechanism. Particularly precisely localized heating of the coating is effected, for example, by the generation of desired interference patterns, such that individual regions can be locally heated.

It is also possible to configure the mechanism for coupling in energy with a material property in such a way that the electron structure of the coating material changes and its optical properties become controllable for compensating for imaging aberrations.

In another embodiment of the projection arrangement, a device for cooling the coating is furthermore provided. A corresponding cooling device serves as a heat sink. Cooling mechanism likewise provided at the edge of the coating, for example, make it possible to control in a targeted manner a heat flow arising as a result of energy being coupled into the coating material. By way of example, in the case of an embodiment of the optical element as a substantially circular lens element or plate, it is possible to use a cooling ring running around the edge of the optical element, for example with Peltier elements. A cooling contact then produces a heat sink, such that a targeted thermal influencing of the coating can take place.

In one embodiment of the projection arrangement, the continuous region comprises at least an area of 20 mm$^2$. In one particularly preferred embodiment, the continuous region comprises, in particular, at least 24 mm$^2$. The continuous region is configured, for example, in round or rectangular fashion or with the geometry of a slot. Particularly in the case where the projection arrangement is used in steppers or scanners for lithographic exposures, a rectangular region is particularly favorable. Furthermore, rectangular surfaces or films of graphene, for example, can be produced comparatively easily. Coated regions of the optical element which are embodied in sickle-shaped or crescent-shaped fashion are furthermore conceivable. Such last-mentioned geometries can be present in the case of use in reflective EUV systems.

The coating for the projection light preferably has a transparency of at least 80% at the wavelength of 193 nm. In particular, the transparency of the coating is at least 95%. Graphene coatings attain corresponding transparencies.

Preferably, the projection arrangement is adapted in such a way that heating of the layer material with the aid of the coupling-in mechanism is greater than the heating of the optical element by absorption of projection light. Imaging aberrations induced by projection light can therefore be compensated for in a simple manner if heating of the layer material is greater in a targeted manner than an aberration originating from undesired heated optical material such as glass or reflection surfaces of optical elements.

The optical element is, for example, a refractive element such as a lens element.

The optical element can also be a reflective element such as a mirror. The mirror then generally comprises a substrate, on which the coating is applied, and further reflective layers for example for reflecting extreme ultraviolet light, DUV light or VUV light, in particular with a wavelength in the range around 193 nm. For reflective optical elements, too, graphene is particularly expediently suitable as a material which can be heated externally, for example with the aid of electrical or magnetic energy. In the case of the use as a mirror, it is also advantageous that the optical element can be driven by electrodes which are fitted laterally, that is to say are not present in the beam path.

Since graphene as coating material is present in particularly thin fashion and with little roughness, that is to say can be arranged homogeneously relative to the coating surface, hardly any layer stresses arise, which is advantageous particularly in the case of EUV optical units. In contrast to matrix-like heating wire arrangements, the graphene coating does not lead to deformations.

In one development of the projection arrangement, a sensor device is furthermore provided, which is adapted for detecting imaging properties of the projection arrangement and/or detects a position of the optical element.

A control device is provided, for example, for controlling the coupling-in mechanism depending on a sensor signal generated by the sensor device. In particular, it is possible to drive, for example, current sources depending on imaging properties of the optical element or of other optical elements in the projection arrangement. An automatic adaptation of the heat input with the aid of the coating can thus be effected in a controlled manner via a control device. In this case, the imaging property of the entire optical projection arrangement that is detected by the sensor can be optimized.

By way of example, a CCD detector is appropriate as sensor. Furthermore, it is possible to provide a position-sensitive sensor that detects a relative position of optical elements, for example, with respect to predetermined positions. With the aid of detected interference patterns, by way of example, a lens element surface of optical elements or else a mirror surface can be detected and measured. Furthermore, temperature sensors can be used.

Furthermore, a method for operating a corresponding projection arrangement is proposed. In this case, energy is successively coupled into the layer material, wherein a resulting temperature distribution of the coating changes an optical property of the optical element in such a way that alterations of the imaging properties of the projection arrangement that are induced by radiation light, in particular, are at least partly compensated for.

In this case, the method can comprise one or more of the following steps: producing a plurality of electric current densities in the coating material over a respective predetermined period of time;

detecting a disturbance temperature distribution of the optical element, in particular with the aid of a thermal model; and/or producing a temperature distribution in the layer material for compensating for changes in the optical properties of the optical element induced by the detected disturbance temperature distribution.

By way of example, currents are sequentially injected into the coating, the currents in each case heating predetermined regions. On account of only limited thermal conduction properties of the coating and of the material of the optical element, a resultant geometrical temperature distribution arises. Consequently, virtually any desired temperature distribution patterns can be produced. The resultant temperature distribution can be continuously adapted to the conditions. By way of example, the coupling of energy into the coating is adapted depending on detected imaging properties of the projection arrangement, thus resulting in a reduction of imaging aberrations.

Further possible implementations or variants of the projection arrangement or of the method also encompass combinations—not explicitly mentioned—of features or aspects described above or below with regard to the exemplary embodiments. In this case, the person skilled in the art will also add individual aspects as an improvement or supplementations to the respective basic form.

Further configurations of the invention are the subject matter of the dependent claims and of the exemplary embodiments of the invention described below. The invention is explained in greater detail hereinafter on the basis of exemplary embodiments with reference to the accompanying figures.

In this case, in the figures.

Identical or functionally identical elements are provided with the same reference signs in the figures, unless indicated otherwise.

Figure 1:
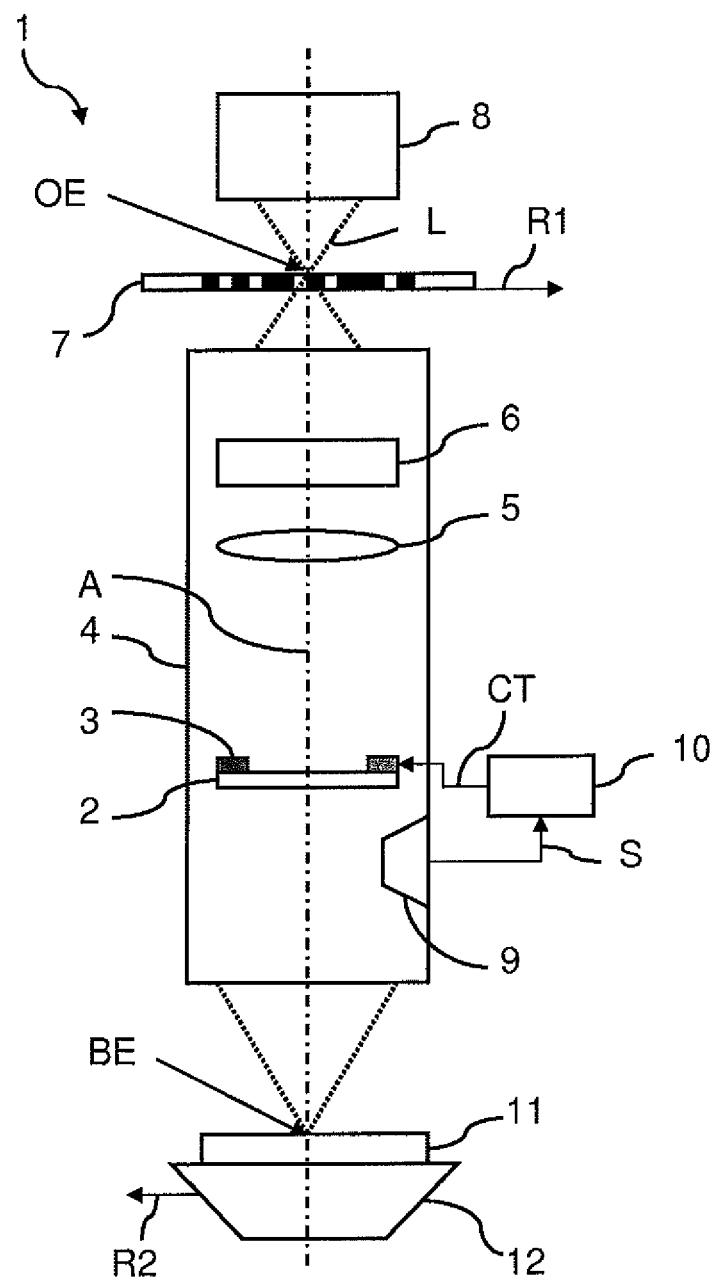
FIG. 1 shows a schematic illustration of an exemplary embodiment for a lithography apparatus comprising a projection arrangement.

FIG. 1 shows a schematic illustration of an exemplary embodiment for a lithography apparatus comprising a projection arrangement. In this case, the lithography apparatus 1 comprises an illumination device 8, which generates projection light L. Wavelengths in the deep ultraviolet spectral range are increasingly being used for micro- or nanolithographic applications. In particular, wavelengths of 193 nm are customary. A corresponding UV projection light L is supplied by an argon fluoride excimer laser, for example. The illumination device 8 comprises optical devices for concentrating the light, these optical devices not being illustrated in more specific detail.

The lithography apparatus 1 serves to image lithographic structure information stored or reproduced in masks or reticles 7 onto a suitable photoresist of wafers 11 to be processed. An exposure of the wafer 11 is often effected section by section, by the reticle or the mask 7 being moved step by step in the object plane OE. A movement in the direction of the arrow R1 is indicated in FIG. 1. At the same time, the wafer 11 to be exposed is moved antiparallel in the image plane BE with the aid of the wafer station 12. The direction is indicated by R2 in FIG. 1. Striped or usually rectangular sections of the wafer 11 can thus be exposed successively. This is also referred to as scanning or stepping.

The actual optical unit is realized in an optical system 4 comprising various optical elements 2, 5, 6. By way of example, lens elements 5, mirrors 6 or else plane plates are appropriate as optical elements. A multiplicity of optical components such as refractive, reflective or other types of optical elements can be used in the corresponding optical system 4.

The material of the optical elements used in the optical system 4 can be heated non-uniformly by the projection light beam L. In particular, a thermal expansion of the materials respectively used, such as glass or ceramics, can take place. This can therefore be accompanied by an undesired change in imaging properties. In order to compensate for corresponding effects induced by projection light, an optical element 2 having at least partly an areal coating composed of a layer material is provided in the optical system or the projection arrangement 4. Furthermore, coupling-in mechanism 3 for coupling energy into the coating or the layer material of the optical element 2 are provided. The layer material at the optical element 2 is configured in such a way that it firstly changes its refractive index or the optical path length as a result of a temperature change and secondly converts energy coupled in by the mechanism 3 into thermal energy. In this case, the mechanism for coupling in energy, for example electrical contacts or an irradiation mechanism, is arranged laterally outside the beam path, that is to say distinctly outside the optical axis A.

The coating, which can be, for example, a graphene layer on a lens element surface, allows a targeted thermal input into the layer material and indirectly into the material from which the optical element 2 is produced. Since graphene, in particular, is substantially transparent to projection light around 193 nm, it is also possible to talk of a wavefront manipulator in transmitted-light operation. Since a coating such as one composed of graphene can be realized particularly easily areally and homogeneously, there is the possibility of arranging the optical element 2 or the wavefront manipulator 2 in proximity to the field.

The lithography apparatus furthermore comprises a sensor device 9, which is configured as a CCD camera, for example. The CCD camera 9 detects, for example, imaging properties of the optical system 4 and supplies corresponding sensor signals S to a control device 10, which is designed to perform a method for operating the projection arrangement or the lithography apparatus 1. Via suitable control signals CT, the control device 10 controls the mechanism for coupling energy into the coating of the optical element 2 in such a way that imaging aberrations can be reduced or compensated for. Alternatively, it is also possible to provide a sensor device 9 which directly detects the position of surfaces, of the lens elements and/or mirrors provided in the optical system 4. Overall, the control device 10 effects an optimization of the imaging properties of the lithography apparatus with the aid of the wavefront manipulator 2, 3. The sensor 9 can detect lens element aberrations, for example, and the control device 10 controls a temperature or heat input into the areal and transparent coating of the wavefront manipulator in the beam path.

In principle, sensor devices 9 are suitable to detect variables which influence imaging-relevant properties of the optical element 2. By way of example, the weight, the position, the temperature and the like can be detected.

Possible exemplary embodiments of optical elements 2 are elucidated in greater detail in FIGS. 2-9.

FIG. 2 shows a schematic illustration of a first exemplary embodiment of an optical element which can be configured as a wavefront manipulator.

Figure 2A:
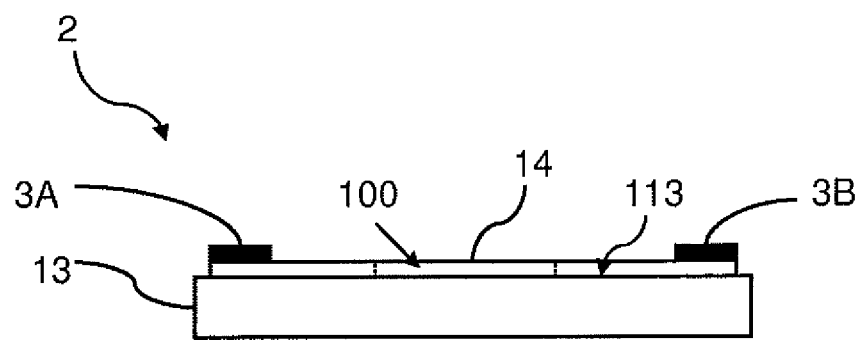
FIGS. 2A-2B shows a schematic illustration of a first exemplary embodiment of an optical element.
Figure 2B:
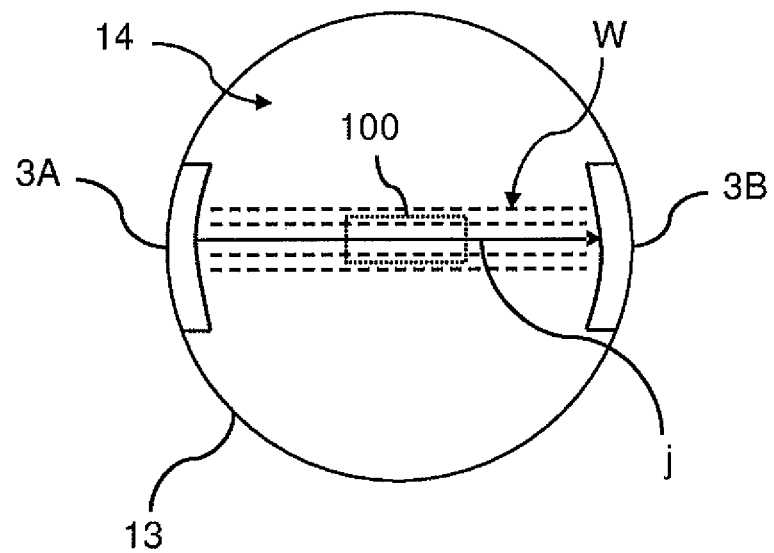

FIG. 2A reveals a cross section, and FIG. 2B a plan view. The optical element 2 used in a beam path of an optical system, as illustrated in FIG. 1, for example, can have refractive properties. However, it is also conceivable for a wavefront manipulation merely to be effected by thermal influencing of the materials used. By way of example, a plane quartz glass plate 13 is inserted into the beam path of a lithography apparatus (cf. FIG. 1) in proximity to the field.

FIG. 2A illustrates a glass body 13, which is transparent in particular to the UV radiation at 193 nm. A thin transparent coating 14 is applied to a surface 113 of the glass body 13. The transparent coating 14 can comprise, in principle, metal such as chromium or else molybdenum sulfide. Preferably, however, graphene is used as coating material. In this case, a continuous region 100 is provided with the graphene coating 14. The continuous region 100 comprises the optically used region of the optical element 2 and corresponds, for example, to a rectangular slot of 20 to 24 mm². The size of this homogeneous coating, which is designated hereinafter as graphene coating or graphene heating layer, makes it possible to insert the wavefront manipulator 2 in the beam path in proximity to the field. Depending on methods for producing the graphene layer, larger elongate strip-like regions are also conceivable. By way of example, it is possible to perform narrow elongate strip coatings in such a way that projection light used for imaging purposes passes in each case through the coating. Particularly in the case of steppers as lithography apparatuses, only narrow rectangular regions of the lens elements or mirrors are used optically. However, geometries are also conceivable where the graphene heating layer is embodied in circular fashion with radii of between 40 mm and 160 mm. Particularly in the case of VUV applications, complex geometries of the optical "footprint" are also possible.

It is furthermore possible to provide only those surface regions with a graphene heating layer which require particularly high compensation of undesired thermal effects. These are, for example, outer edge regions of an optically used region of a lens element.

In the illustration and embodiment in FIG. 2, the wavefront manipulator 2 furthermore has two electrodes 3A, 3B, which are electrically conductively connected to the coating 14. The plan view in FIG. 2B reveals two areal electrodes 3A, 3B arranged at opposite edges of the circular glass plate 13. Via the electrical contacts or electrodes 3A, 3B, an electric current having a current density j can be generated in the conductive graphene layer 14. A targeted heating of the graphene layer 14 arises as a result of the conversion of electric current into thermal energy W. As a result of a targeted heating or as a result of a targeted coupling-in of the electrical energy as current density distribution j, firstly the graphene can be heated, but secondly also the glass body 13 in the region of the current j, as a result of which overall the optical properties are altered. By way of example, an optical path length or the refractive index changes as a result of the heating.

The layer material or the graphene coating is firstly transparent and secondly electrically conductive. Furthermore, the graphene material is particularly smooth and has a roughness of only a few nanometers. In this respect, the graphene serves as a transparent, electrically conductive coating, the temperature distribution of which can be set. WO 2011/016837, to which reference is made in the entire scope thereof, mentions production methods and properties of graphene layers. The graphene can preferably be applied as a monolayer having a thickness of less than 1 nm, wherein a transparency to the light having the wavelength of 193 nm is above 97%. However, it is also conceivable to provide a plurality of layers of graphene as coating. Preferably, the graphene coating has a thickness of up to 24 nm. Corresponding graphene coatings or films have electrical conductivities of up to 375 S/cm. Investigations have revealed that graphene coatings of, in particular, between 8 nm and 24 nm can easily be applied to quartz glasses.

The lateral arrangement of the electrodes now allows an electric current to be applied to the areal, homogeneous coating 14. In order to alter the conductivity or electrical properties of the graphene coating, a doping of the graphene material is also possible. The graphene coating can be effected, in particular, by chemical vapor deposition (CVD). In this case, a catalyst layer is usually provided, to which a hydrocarbon-containing gas is applied. The respective catalyst, such as a nickel-chromium layer, for example, has the effect that graphene grows on the surface of the catalyst. The graphene layer, which can comprise one or a plurality of layers, is subsequently applied to the actual carrier, such as a glass plate or a lens element surface. Corresponding methods for transferring grown graphene layers to further substrates are known.

The graphene heating layer or coating 14 transparent to the projection light can be modeled, for example, as a rectangular or parallelepipedal material layer. In order that lithography apparatuses as steppers or scanners generally image strip-shaped images onto wafer structures with edge acuity, a continuous region 100 of approximately 20 mm² suffices, in principle. By way of example, the region or the coating material has a width b, a length l and a height or thickness h. If electric current is injected from an edge or marginally, a cross-sectional strip $F=b \times l$ arises. On the basis of an electrical conductivity σ in [S/m] of graphene, an electrical resistance $R=l/(\sigma F)$ arises. In general, an ohmic resistance can be assumed in the case of a graphene layer. Therefore, a thermal power of $P=U^2/R$ generated in the graphene strip 100 and an area-related thermal power density of $P/(bl)=\sigma h \, U^2/l^2$ are obtained. Given a thickness h=8 nm, an assumed electrical conductivity σ=375 S/cm and an electrical voltage of U=52 V, a thermal power density of 80 W/m² arises. In this case, the graphene strip or parallepiped is assumed to have a width of b=1 mm and a length of l=10 cm. In the case of only a small number of graphene layers or, for example, one monolayer of only one nanometer, although higher voltages are necessary, this is approximately 146 V particularly in the case of the abovementioned computation example giving a thickness h=1 nm. Such voltages are manageable in lithography apparatuses. In this respect, energy can be coupled into the coating cost-effectively via current or voltage sources which can be driven in a simple manner.

Figure 3:
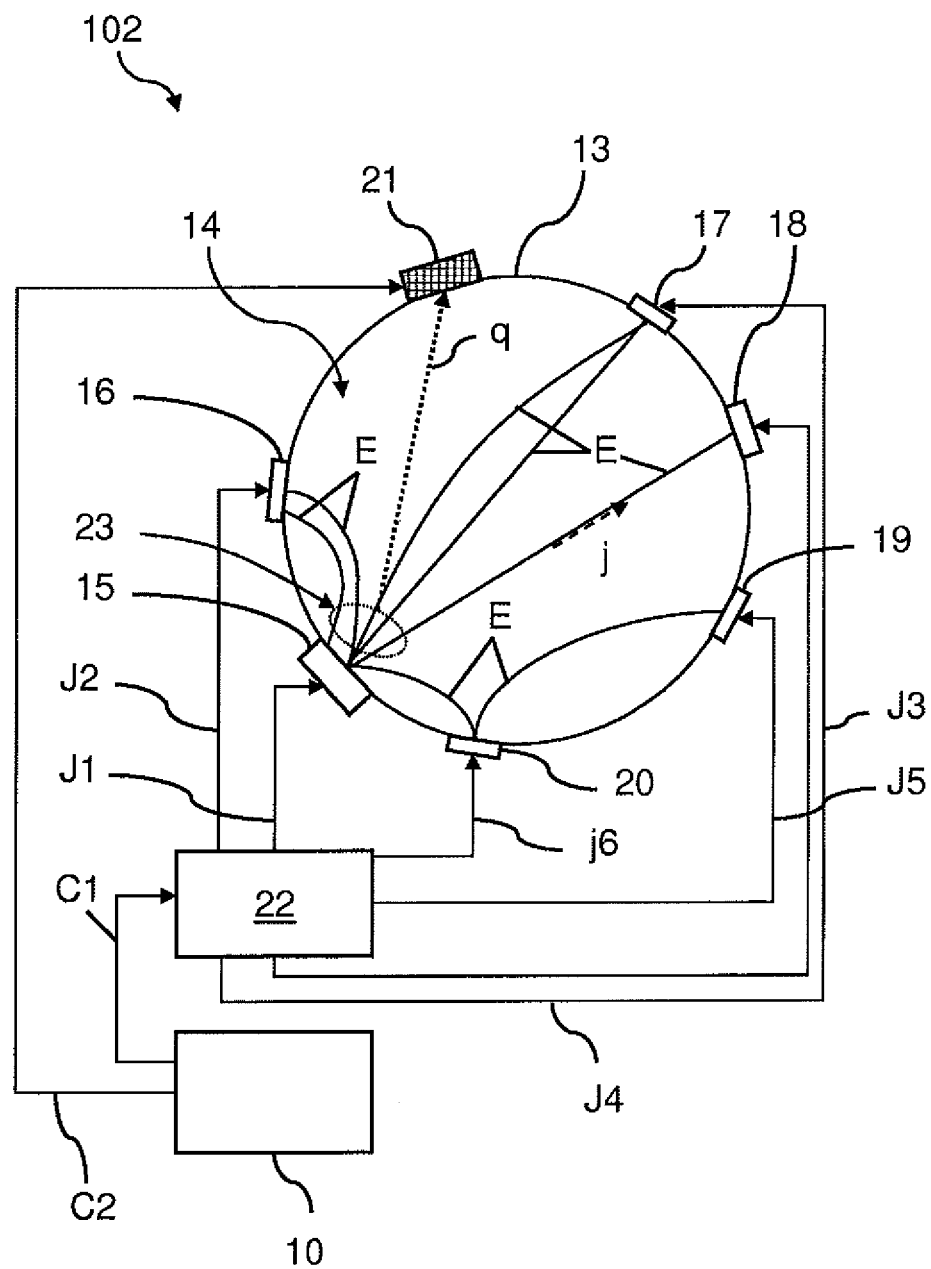
FIG. 3 shows a schematic illustration of a second exemplary embodiment of an optical element.

FIG. 3 illustrates a development of an optical element as a wavefront manipulator. The optical element 102, for example in the manner of a quartz glass plate or a lens element with a graphene coating 14, is provided marginally with a plurality of electrodes 15, 16, 17, 18, 19, 20. The contacts or electrodes 15-20 are arranged on the circumference of the circular glass plate 13 in electrical contact with the coating 14. Furthermore, a controllable current source 22 is provided, which is coupled to the six electrodes 15-20. Via the controllable current source 22, it is possible to inject a respective current J1-J6 for generating corresponding current densities in the graphene to the contacts 15-20 or into the coating 14, which is configured as a preferably homogeneous graphene layer. The controllable current source 22 is controlled by a control device 10 via suitable control signals C1.

Furthermore, by way of example, a controllable cooling element 21 is likewise provided in thermal contact with the coating 14 or the glass body 13. This cooling device 21, which can be configured as a Peltier element, for example, also lies outside the beam path of the respective lithography apparatus.

Electric field lines E are indicated in the graphene heating layer 14 in the plan view in FIG. 3, the field lines running between the contacts 15-20. By way of example, an electric current density j between the electrode 15 and the electrode 18 is indicated as a dashed arrow. When the controlled current sources 22 are switched on, this results in a particularly high thermal power in regions of high electric field line densities. A corresponding region 23 in the vicinity of the contact electrode 15 is indicated in a dotted manner in FIG. 3. If currents are injected uniformly, greater heating takes place in the region 23 of the graphene layer 14. Since the cooling contact 21 can furthermore operate as a heat sink, a heat flow designated by q and represented by a dotted arrow arises, for example. In this respect, via a plurality of electrodes 15-20 and a targeted injection of currents J1-J6 it is possible to produce a targeted manipulated heat conversion in the graphene layer and thus to alter the temperature in a localized manner. It is thus possible, by way of example, via the control device 10, to ensure a compensation of imaging aberrations which can occur as a result of heating of the optical elements in the respective projection system or of the optical element as a result of absorption of projection light.

As an alternative to the exemplary illustration in FIG. 3, the control device 10 can control the current source 22 for example also in such a way that an electric current substantially flows between the electrodes 17 and 18. That is to say that, in the orientation of FIG. 3, a conversion of the electrical energy into thermal energy occurs in the region at the top right of the glass disk 13. If cooling is simultaneously effected via the cooling device 21 embodied as a Peltier element, a heat flow (not illustrated here) arises at the upper edge of the glass plate 13 or of the graphene coating 14. In this respect, the transparent and electrically conductive graphene layer 14 enables a targeted thermal manipulation of the optical element embodied, for example, as a lens element 102.

Figure 4A:
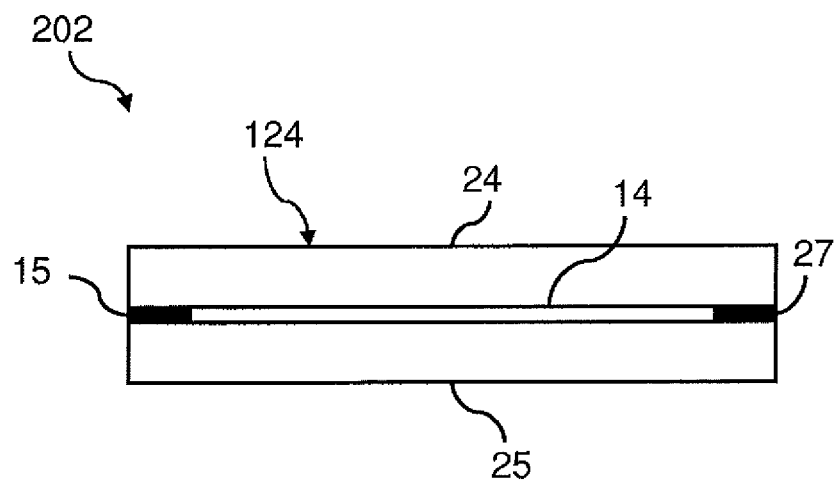
FIGS. 4A-4B shows a schematic illustration of a third exemplary embodiment of an optical element.
Figure 4B:
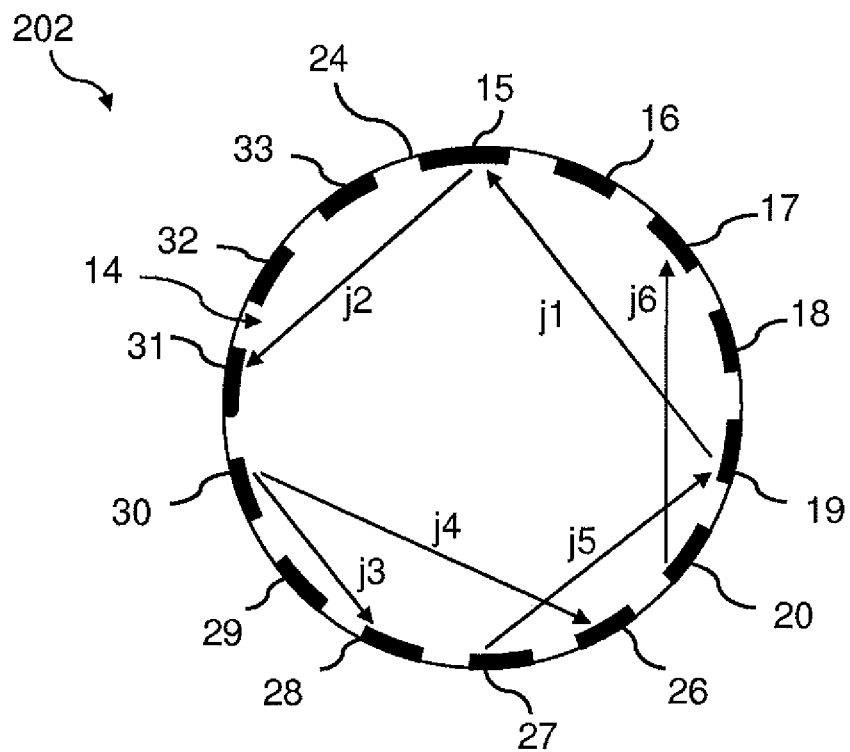

FIG. 4 illustrates a third exemplary embodiment of a corresponding optical element as a wavefront manipulator. The optical element 202 is configured, for example, as a graphene layer 14 between two quartz glass plates or else calcium fluoride plates 24, 25. FIG. 4A shows a cross-sectional view, and FIG. 4B a plan view.

A graphene layer, for example a 1 nm thick trilayer, is once again assumed. In the exemplary embodiment, 14 electrodes 15-20, 26-33 are arranged marginally in electrical contact with the graphene coating 14. Electric current is injected into the graphene layer 14 in a manner controlled by a control device (not illustrated in FIG. 4) and corresponding current or voltage sources. The thermal power distribution and thus the heating of the graphene layer 14 are dependent on the respective electric currents through the layer.

Energy is then successively coupled into the layer material in such a way that a resultant temperature distribution of the coating alters an optical property of the optical element such that undesired changes in the imaging properties are compensated for. For this purpose, suitable resultant temperature distribution patterns can be generated by the superposition of individual temperature distribution patterns.

In order to generate a ring-shaped thermal power distribution, for example, it is possible to generate sequentially, that is to say successively, current densities between pairs of electrodes. FIG. 4B shows, by way of example, a current density j1 between the electrodes 19 and 15, a current j2 between the electrodes 15 and 31. Currents between the electrodes 30 and 28 (j3), between the electrodes 30 and 26 (j4), between the electrodes 27 and 19 (j5) and between the electrodes 20 and 17 (j6) are furthermore indicated. In order to achieve a desired heat distribution or a desired manipulated heating of the graphene layer 14, the currents are injected successively, that is to say the current density j1 at the instant t1, the current density j2 at the instant or over a predetermined time period t2, and the current densities j3, j4, j5 and j6 over further instants or time periods t3-t6. The respective thermal powers add up to form a desired thermal power distribution. In this case, the heat capacity of the concomitantly heated quartz glass plates 24, 25 can be utilized. In principle, via the large number of marginally arranged electrodes 15-20, 26-33 and virtually arbitrarily injectable currents and current directions, it is possible to generate any desired geometrical thermal power distribution in the coating and the adjacent lens element material. The individual thermal powers as a result of the injected current densities j1-j6 add up even though the latter are fed in sequentially.

It is also possible to provide more than the 14 electrodes illustrated in FIG. 4B. In this respect, in specific embodiments and implementations of the wavefront manipulator, sequential driving of different pairs of electrodes is effected by a control device. Since graphene is electrically conductive, contact-connection via contact electrodes such as have been mentioned in the previous exemplary embodiments can be realized cost-effectively.

Figure 5A:
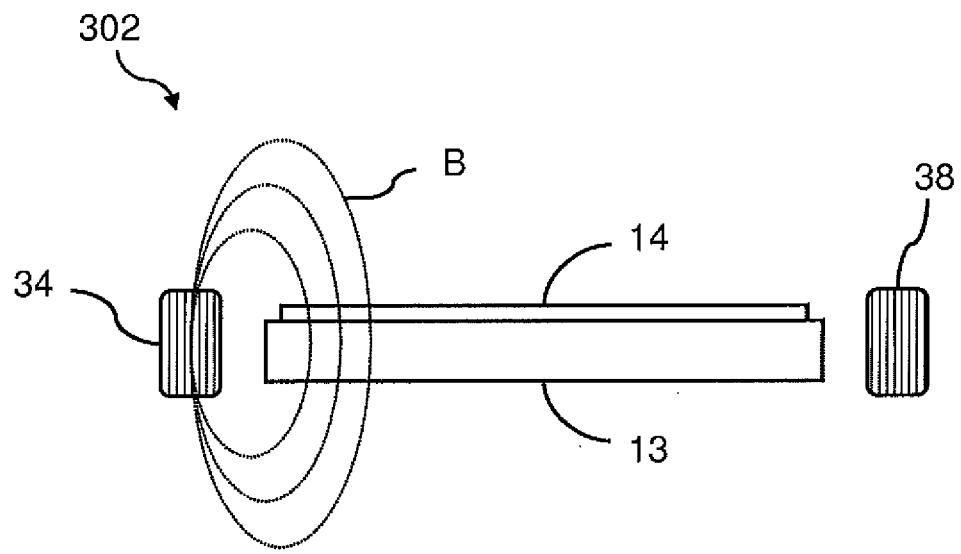
FIGS. 5A-5B shows a schematic illustration of a fourth exemplary embodiment of an optical element.
Figure 5B:
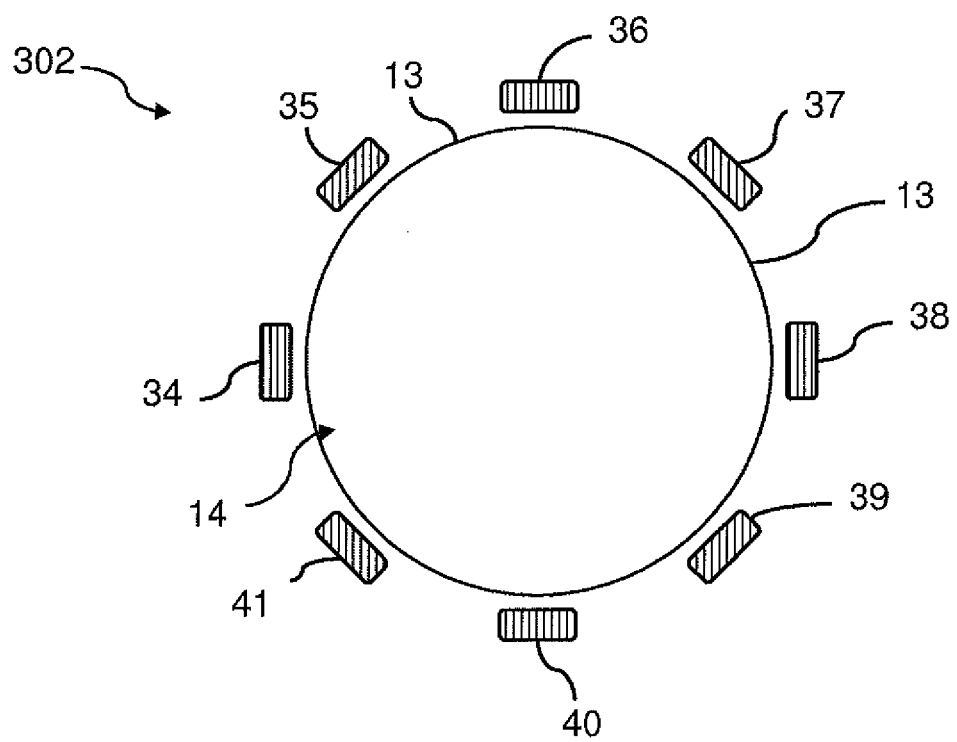

FIG. 5 shows a fourth exemplary embodiment of a wavefront manipulator 302 that can be used in the field, that is to say in proximity to the field. FIG. 5A shows a cross-sectional view, while FIG. 5B shows a plan view. By way of example, a calcium fluoride or quartz glass plate 13 with a graphene coating 14 is once again provided. In the embodiment in FIG. 5 of a wavefront manipulator 302, no contact electrodes are provided. Rather, energy is input into the graphene layer 14 by induction with the aid of controllable magnets. Therefore, magnet coils 34-41 are arranged around the glass disk 13 with the graphene coating 14.

FIG. 5B reveals that the magnet coils 34-41 are arranged around the circumference of the, for example circular, glass plate 13. The magnet coils 34-41, which are individually drivable, for example, generate alternating magnetic fields. By way of example, a magnetic field B is indicated in FIG. 5A. As in the case of induction hobs, eddy currents are generated, for example, in the graphene layer 14 by induction. Through selection of the temporal and geometrical configuration of the magnetic fields B, it is possible to set precise eddy current generation locally in the graphene layer 14.

The contactless supply of magnetic energy for generating electric currents in the graphene layer 14 and subsequent conversion into thermal energy is suitable, in particular, for example if the respective optical element 302 has to be used in an ultra high vacuum. The magnetic fields can then be generated externally outside the vacuum region, without for example electrode material, which can have impurities, having to be present directly on the optical element 302. In this respect, the optical element 13 can also be understood as a mirror. Reflective optical units are used, in particular, in the case of projection using deep ultraviolet light. The currents generated in the graphene layer 14 in turn supply heating of the graphene layer 14 and thus alteration of the optical properties both of the graphene layer 14 and potentially of the concomitantly heated glass plate 13.

Figure 6A:
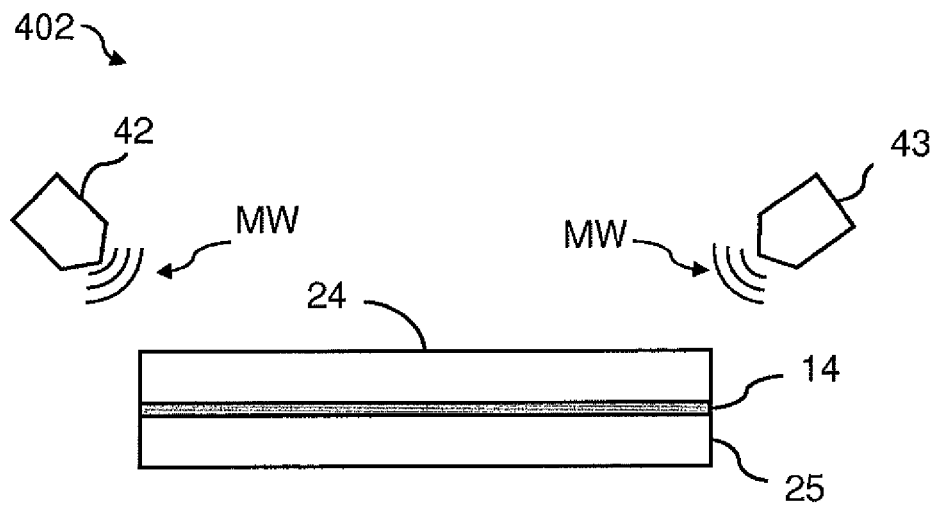
FIGS. 6A-6B shows a schematic illustration of a fifth exemplary embodiment of an optical element.
Figure 6B:
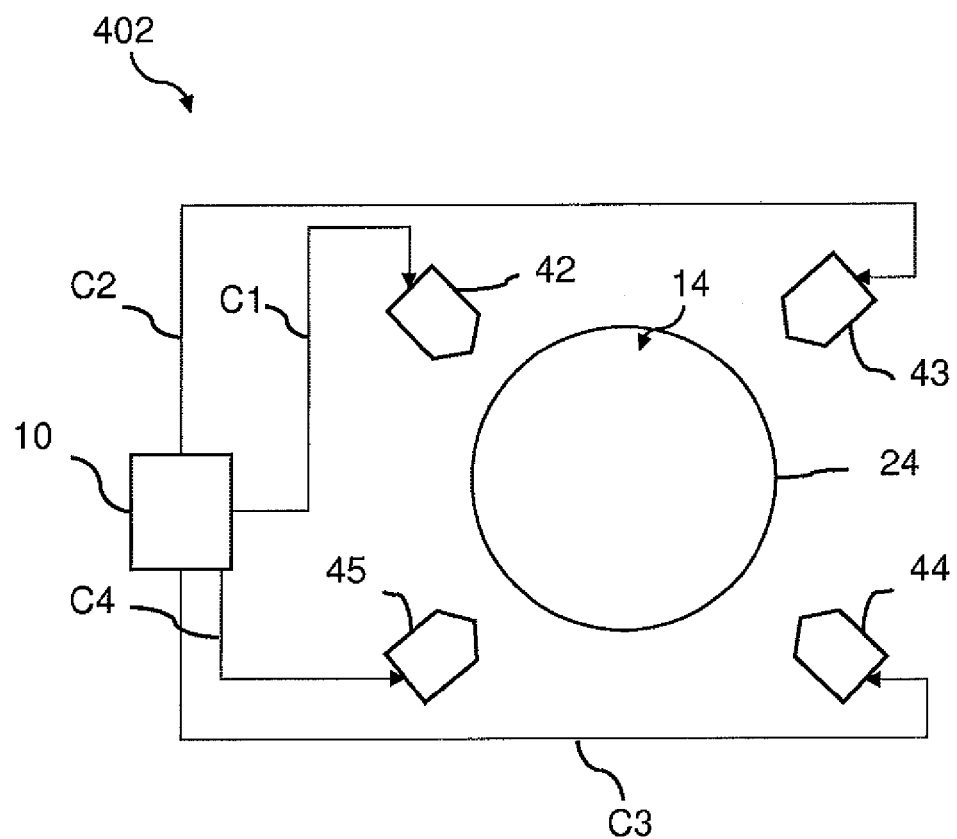

FIG. 6 illustrates yet another embodiment of a wavefront manipulator, wherein energy is input via electromagnetic radiation. FIG. 6A shows a cross-sectional view of an optical element 402 with, for example, a graphene layer 14 arranged between two glass layers 24, 25. FIG. 6B shows a plan view of the glass plates with the graphene coating 14 that are used in the beam path. Since the graphene 14 is electrically conductive and transparent, in particular to the used wavelengths of between 190 nm and 250 nm, for example, energy can be coupled in for example via microwave irradiation. The microwaves MW generate currents and thus heat in the graphene layer 14. For this purpose, four microwave antennas 42, 43, 44, 45 suitable for introducing microvave radiation MW are provided around the glass plates 24, 25 coated with graphene. The used wavelength or frequency of the microwaves MW can be adapted to the electronic properties of the graphene.

FIG. 6B furthermore shows a control device 10, which drives the microwave antennas 42, 43, 44, 45 via control signals C1, C2, C3, C4. With the aid of the introduction of electromagnetic radiation, in particular in the form of microwaves, regions in the graphene layer 14 can be heated in a targeted manner, for example. In this respect, a manipulated heat input can be performed locally in a targeted manner. With the use of a plurality of microwave antennas 42, 43, 44, 45, it is furthermore possible, for example via interference patterns, to obtain a desired heating of the graphene locally and with a predeterminable geometry.

It is also conceivable for the electron structure of the material used as coating material to be altered by the introduction of specific electromagnetic radiation.

Moreover, the presented mechanisms for coupling energy into the coating material can also be used in combination with one another. By way of example, it is conceivable to use electrode arrangements, such as are indicated in FIG. 4, and also magnet coils as well as microwave generators. Overall, particularly in the case where graphene is used, this results in a simple and flexible possibility for setting heat generation locally.

FIG. 7 illustrates one possibility for defining locally in a coating subsegments which can be heated substantially separately from one another. No shadings or diffractions of projection light in transmitted-light operation arise in this case.

Figure 7A:
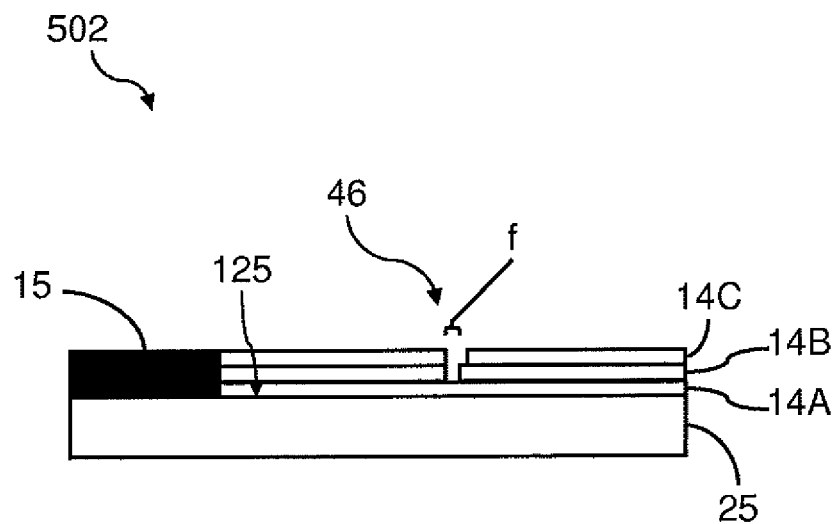
FIGS. 7A-7B shows a schematic illustration of a sixth exemplary embodiment of an optical element.
Figure 7B:
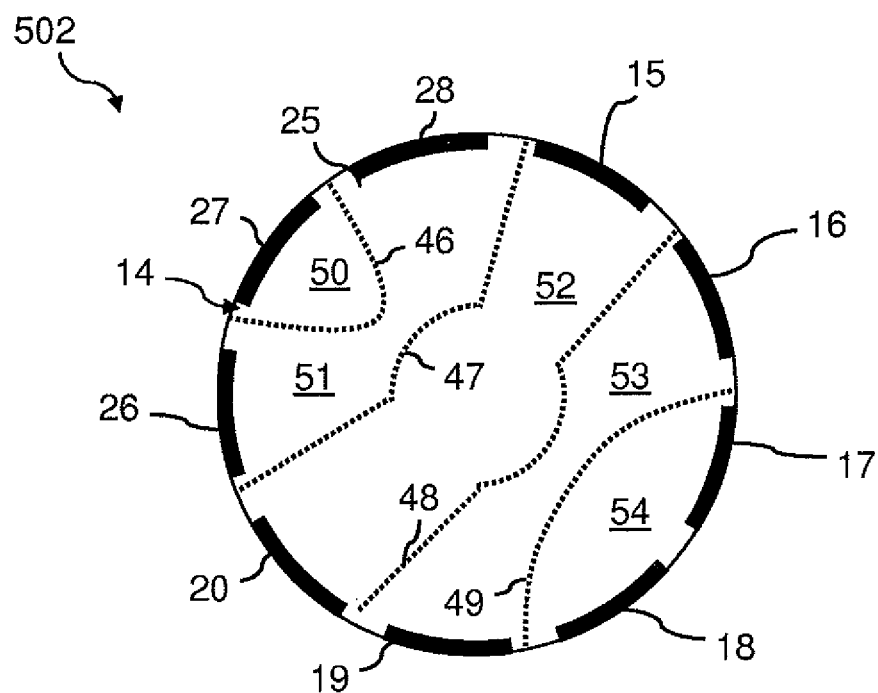

FIG. 7 therefore shows a sixth exemplary embodiment of an optical element 502 embodied as a wavefront manipulator. FIG. 7A shows an excerpt from a cross-sectional illustration, and FIG. 7B a plan view.

FIG. 7A reveals once again a glass body 25 in an excerpt, a graphene coating 14 being applied on the glass body. The graphene layer 14 is embodied in multilayered fashion, illustrated with three layers 14A, 14B, 14C in the example in FIG. 7A. An electrode 15 for electrical coupling to the graphene is illustrated marginally. It is possible to incorporate grooves into the multilayered graphene layer. FIG. 7A shows in cross section a groove, fissure or indentation 46. The grooves 46 can be achieved chemically or else mechanically, for example by mechanical stress. In the region of the groove 46, the top two monolayers 14C and 14B are removed, for example, such that only one monolayer 14A remains directly on the glass body 25.

In this case, an extent f of the groove 46 is $f<\lambda$, wherein is the wavelength of the projection light used. With the use of ultraviolet light where $\lambda=193$ nm, f is between 50 and 100 nm, for example. By virtue of the grooves, also designated here as sub-lambda indentations, the light is not diffracted, and so the layer remains substantially transparent optically and does not bring about any disturbance in the beam path. However, the electrical resistance is increased in the region of the groove 46, such that the individual layer regions or segments 50-54, as are indicated in FIG. 7B, can be better driven independently of one another.

The grooves 46 can, as illustrated in FIG. 7B, for example, define regions or segments 50-54 within the boundaries of which, through the grooves 46-49, an increased heat input via electric current is possible in a targeted manner. FIG. 7B shows marginally nine electrodes 15-20, 26, 27, 28 and four sub-lambda indentations 46, 47, 48, 49, which delimit five segments 50, 51, 52, 53, 54 from one another in or on the coating 14. Suitable driving of the electrodes 15-20, 26, 27, 28 makes it possible, in particular, to heat the partial regions or segments 50-54 of the coating independently of one another.

By virtue of the increased resistance of the grooves 46, 47, 48, 49, the segments can also be heated more easily individually by a respective current flow. It is also conceivable for a groove to be produced completely down to a surface 125 of the carrier material, that is to say of the glass body 25. An electric field strength then arises transversely with respect to the groove, however. By way of example, given a groove width f=100 nm and a potential difference of 1 V between adjacent segments, a field strength of $10^7$ V/m can arise. Preferably, therefore, single- or multilayered layers are left, rather, in the groove bottoms or valleys.

Figure 8A:
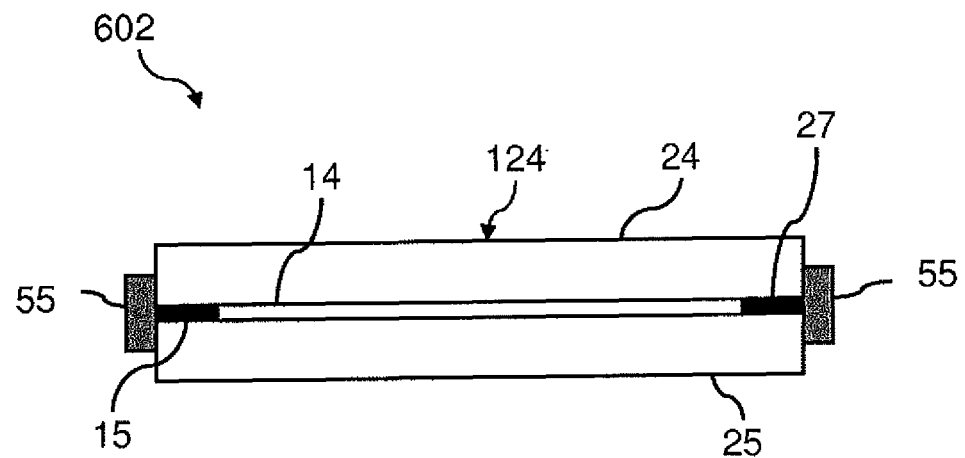
FIGS. 8A-8B shows a schematic illustration of a seventh exemplary embodiment of an optical element.
Figure 8B:
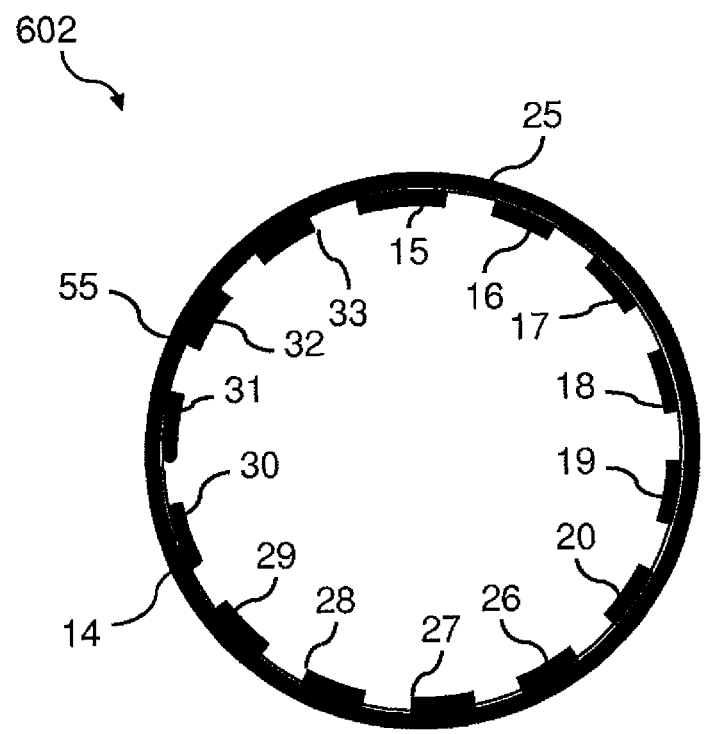

FIGS. 8A-8B show yet another exemplary embodiment of a wavefront manipulator 602. In this case, a graphene layer 14 is once again arranged between two quartz glass plates 24, 25. By way of example, the graphene layer 14 is a trilayer. An electrode arrangement 15-20, 26-33 is provided laterally in the interspace. In a manner similar to that in FIG. 4, the electrodes 15-20, 26-33 can be driven in a targeted manner individually and separately from one another, such that substantially any desired current distribution and thus heat flow geometry can be generated sequentially.

A cooling ring or cooling contact 55 is provided in a ring-shaped manner around the optical element. The ring-shaped cooling contact 55 can be embodied, for example, as a Peltier element or else from metal, such as gold. The cooling ring 55 serves as a heat sink in order to dissipate the heat generated by conversion of electrical energy into thermal energy in the heated graphene and adjacent glass layers. Given a 1 nm thin graphene layer 14, which can be present as a trilayer, a thermal conductivity of 12 000 W/mK is expected. That is to say that a graphene strip having a width of 1 mm and a length of 10 cm transports a thermal power of 8 µW given a temperature difference of 80 K. Furthermore, heat is transported into the quartz glass plates 24, 25.

Overall, a shading-free wavefront manipulator which is transparent to UV light, in particular, is afforded in the arrangement in FIG. 8A-8B. One outer surface, for example the surface 124 of the upper quartz glass plate 24, can be configured in aspherical fashion in order to compensate for a null wavefront deformation.

Figure 9:
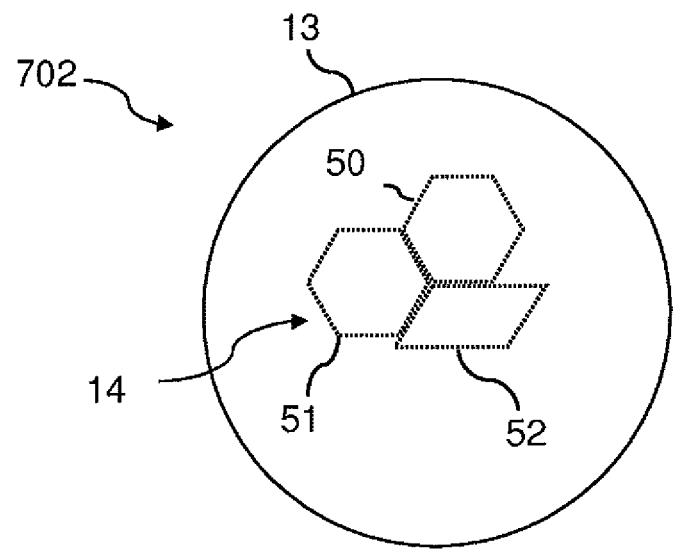
FIG. 9 shows a schematic illustration of an eighth exemplary embodiment of an optical element.

FIG. 9 shows a further exemplary embodiment of an optical element 702 of a wavefront manipulator that can be used in the field, that is to say in proximity to the field. FIG. 9 shows a plan view. By way of example, a calcium fluoride or quartz glass plate 13 with a graphene coating 14 is once again provided. The coating 14 is applied piece by piece to the surface of the plate, thus resulting in segments or partial regions 50, 51, 52. A parqueting of the region 14 to be coated with geometrical identical coating sections is conceivable. However, irregular coverings are also possible. With the use of graphene, it is possible to apply the same as flakes or film pieces 50, 51, 52 onto the surface of the optical element 702. Despite the overall non-continuous area of the coating region 14, no diffraction or shading takes place at the boundaries between the coating partial regions 50, 51, 52, since the coating material is chosen to be sufficiently thin and transparent.

In principle, an entire lens element or plate surface can also be covered with graphene laminae.

Figure 10:
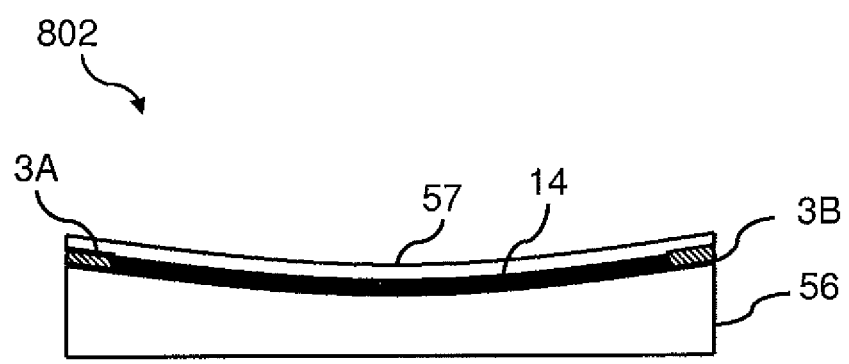
FIG. 10 shows a schematic illustration of a ninth exemplary embodiment of an optical element.

Finally, FIG. 10 illustrates a ninth exemplary embodiment of an optical element 802 that can be used as a wavefront manipulator. The optical element 802 is configured as a reflective element, for example as a mirror. In the exemplary embodiment in FIG. 10, too, in particular a graphene layer 14 is provided for targeted heat input via energetic coupling-in. The mirror 802 comprises a substrate 56, for example composed of suitable ceramic or titanium silicate glass. A graphene layer 14 is applied to the substrate 56, a for example multilayered, layer arrangement 57 as reflective coating in time being provided on the graphene layer.

Laterally, electrodes 3A, 3B are provided circumferentially, for example. The geometry and arrangement of the electrodes can be implemented as explained in the previous exemplary embodiments. Particularly in the case of reflective optical units or optical elements such as are illustrated in FIG. 10, the reflective coating 57 can deform and heat up depending on the incident UV radiation. Via the graphene heating layer 14, the heating can be compensated for locally in a targeted manner, or a homogeneous temperature distribution can be obtained. In this respect, graphene adjoining the electrodes 3A, 3B can be used as a heating layer. Graphene has the advantage that it is particularly smooth and has little surface roughness. In this respect, the reflective coating layers 57 can also be arranged securely and precisely without generating imaging aberrations. One advantage of graphene in this case is also, in particular, its small thickness and good conductivity with regard to electrical transport and heat transport.

FIGS. 11-14 indicate possible positions for optical elements, as shown in the previous illustrations, in an optical system.

Figure 11:
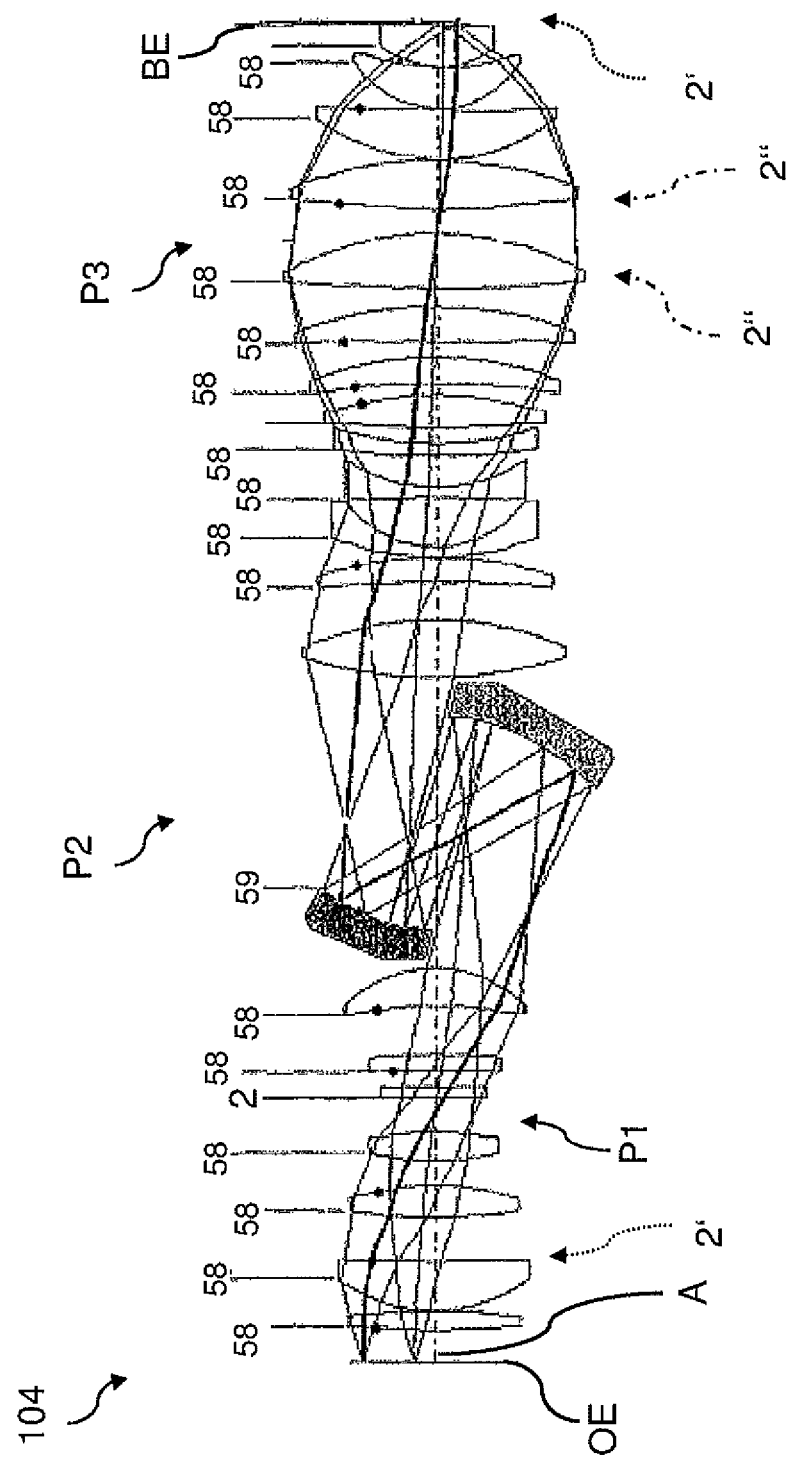
FIG. 11 shows a schematic illustration of a first exemplary embodiment of an optical system comprising a wavefront manipulator.

FIG. 11 shows a schematic illustration of a first exemplary embodiment of an optical system in which a wavefront manipulator with a graphene coating, for example, is used. In this case, FIG. 11 shows an optical unit 104 as illustrated in WO 2005/069055 A2 as FIG. 32. Along the optical axis A, both refractive elements 58 and reflective elements 59 are provided from the object plane OE as far as the image plane BE.

The illustration in FIG. 11 furthermore shows the positions of three pupil planes P1, P2, P3. In a conventional embodiment of the optical system 104, a plane plate is provided on the optical axis on the right of the pupil plane P1. Instead of the plane plate, a wavefront manipulator 2, for example with a graphene coating, is now provided. The arrangement on the right of the pupil plane P1 is neither in proximity to the pupil nor in proximity to the field, but rather intermediate. Since the graphene coating can be realized homogeneously over a continuous region of 10 to 20 mm², for example, the position of the wavefront manipulator at this location is possible without disturbing the beam path. In proximity to the field it is possible to provide the wavefront manipulator at the positions indicated by dotted arrows 2' in FIG. 11. The respective lens element can be split into a plane plate with graphene coating and a lens element, such that a wavefront manipulation takes place. Alternative realizations of the wavefront manipulator in or at optical elements are indicated by 2'' and dash-dotted arrows.

Figure 12:
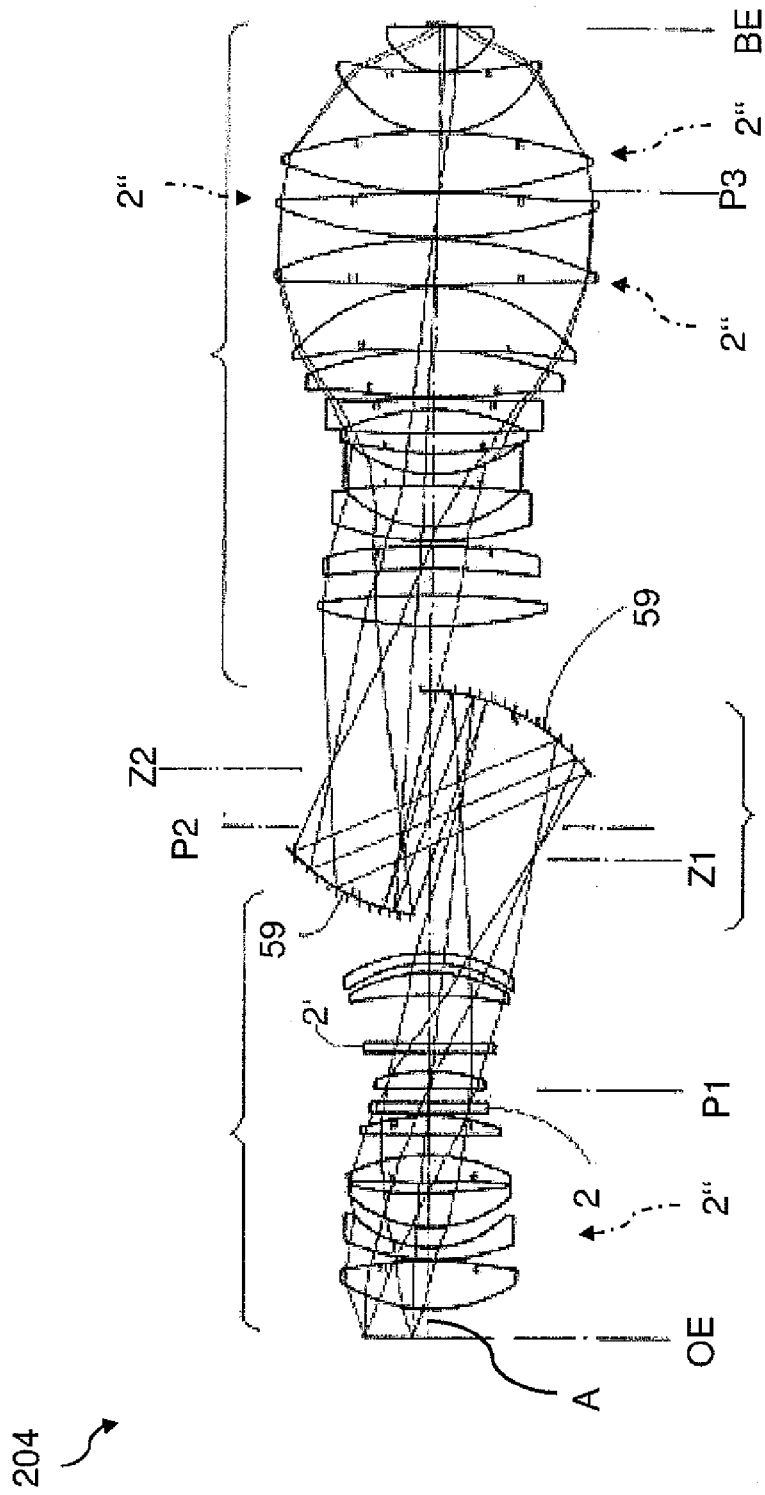
FIG. 12 shows a schematic illustration of a second exemplary embodiment of an optical system comprising a wavefront manipulator.

FIG. 12 shows a further exemplary embodiment of an optical system comprising a wavefront manipulator. The projection lens 204 illustrated in FIG. 12 is disclosed, for example, as FIG. 3 in US2008/0174858 A1. Once again a multiplicity of lens elements and mirrors 59 are provided between the object plane OE and the image plane BE. FIG. 12 furthermore shows three pupil planes P1, P2, P3. Intermediate image planes Z1 and Z2 are furthermore indicated. In order to use a wavefront manipulator in the manner described above, two alternative positions are indicated in FIG. 12. The position 2 is provided substantially in proximity to the pupil in the vicinity of the pupil P1. However, an intermediate position 2' is also conceivable. In proximity to the field, it is possible to provide the wavefront manipulator at the mirrors 59. Alternative realizations of the wavefront manipulator in or at optical elements are indicated by 2'' and dash-dotted arrows.

Figure 13:
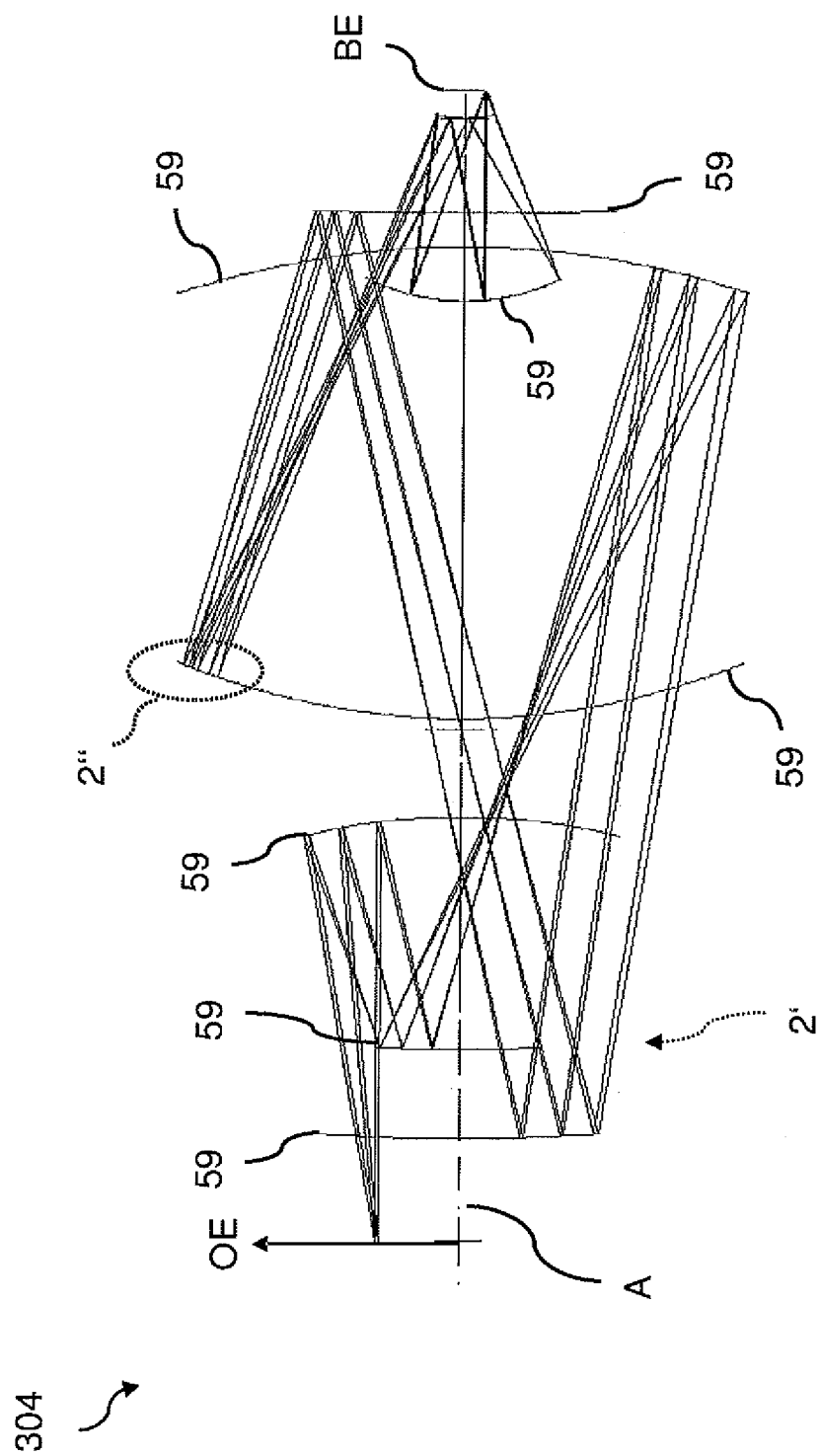
FIG. 13 shows a schematic illustration of a third exemplary embodiment of an optical system comprising a wavefront manipulator.

FIG. 13 shows a schematic illustration of a third exemplary embodiment of an optical system 304 in which a wavefront manipulator with a graphene coating, for example, is used. In this case, FIG. 13 shows an EUV optical unit as illustrated in US2008/0024746 A1 as FIG. 4a. The optical system here comprises eight mirrors 59. Along the optical axis A, mirrors as reflective optical elements 59 are provided from the object plane OE as far as the image plane BE. A wavefront manipulator, for example as a graphene heating layer on one of the mirror substrates, can be provided in particular in proximity to the pupil 2'. A further manipulator 2'' is provided, for example, in proximity to the field at the fourth mirror 59.

Figure 14:
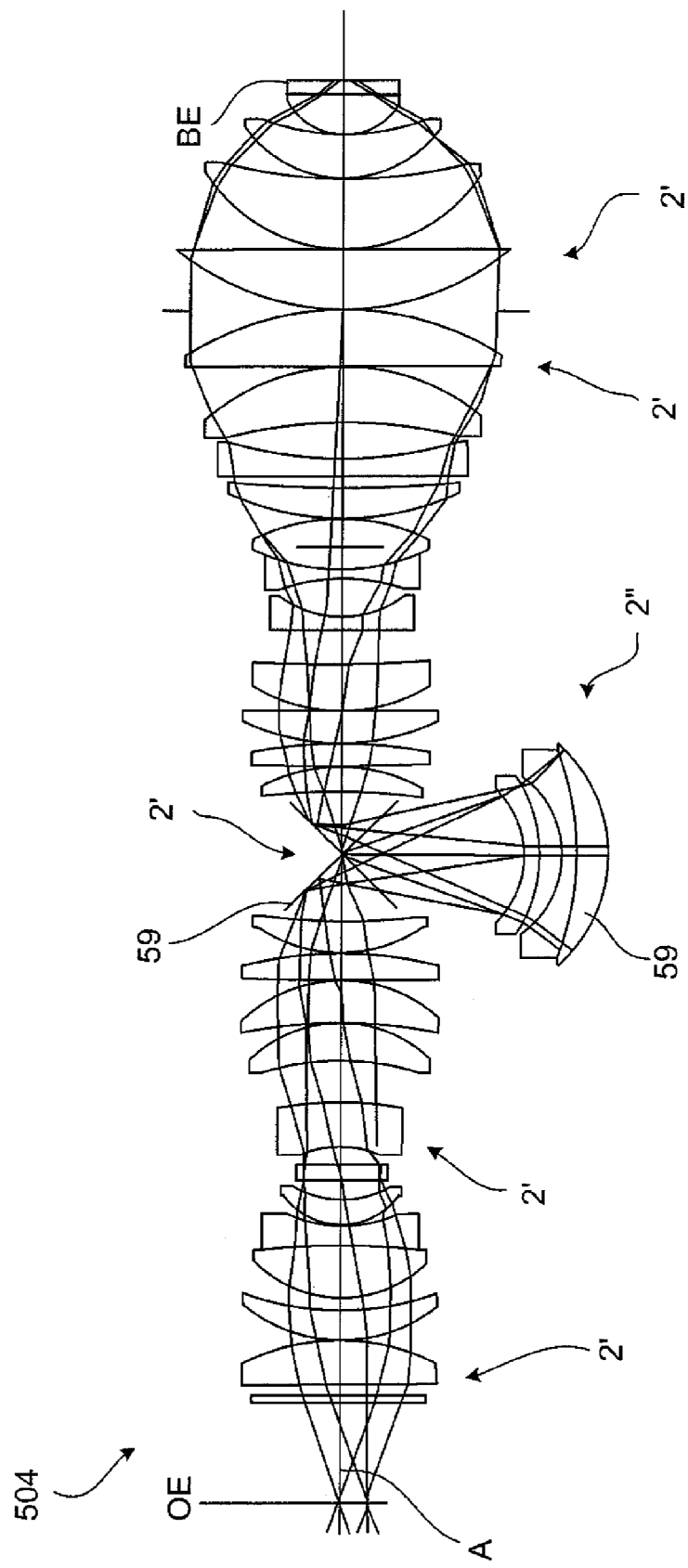
FIG. 14 shows a schematic illustration of a fourth exemplary embodiment of an optical system comprising a wavefront manipulator.

Finally, FIG. 14 indicates a schematic illustration of a fourth exemplary embodiment of an optical system 404 in which a wavefront manipulator with a graphene coating, for example, can be used. In this case, FIG. 14 shows an immersion optical unit for wavelengths of 193 nm, for example, such as is illustrated in EP 1 881 520 A1 as FIG. 6. The optical system also comprises here, alongside refractive optical elements, that is to say lens elements, mirrors 59 between the object plane OE and the wafer or the image plane BE. By comparison with the known arrangement from EP 1 881 520 A1, at least one of the optical elements used is embodied as a wavefront manipulator. FIG. 14 indicates possible positions for arrangements in proximity to the field for a graphene heating layer by means of the dashed arrows 2', 2''.

It may prove to be expedient, in particular, to provide a wavefront manipulator with a graphene coating which serves as a heating layer, specifically in particular at the locations in the beam path where conventionally plane plates are provided in the beam path. Since the graphene layer is transparent, an arrangement is also made possible in the regions in proximity to the field.

Overall, this results in a cost-effective possibility, without the shading of the field and disturbance by diffraction, for example by non-transparent electrodes or heating arrangements, to obtain an easily producible wavefront manipulation for compensating for imaging aberrations.

Although the present invention has been explained on the basis of exemplary embodiments, it is not restricted thereto, but rather can be modified in diverse ways. The proposed materials for the coating and also the thickness and geometrical representation thereof should be understood to be merely by way of example. Although primarily graphene has been discussed, other coating materials which can be thermally excited are also possible. With the aid of a wavefront manipulator, besides the radiation-induced heatings mentioned, it is also possible to compensate for effects attributed to altered material properties of the respective lens element or of the mirror. After relatively long operation, for example, material damage can occur which can alter the imaging properties.

REFERENCE SIGNS USED 1 projection arrangement
2 optical element
3 coupling-in mechanism
4 optical system
5, 6 optical element
7 mask arrangement
8 illumination system
9 sensor device
10 control device
11 wafer
12 wafer station
13 glass body
14 coating
15-20 electrical contact
21 cooling contact
22 current source
23 region
24, 25 glass plate
26-33 electrical contact
34-41 coil
42-45 antenna
46-49 groove
50-54 coating section
55 cooling ring
56 mirror substrate
57 reflective coating
58 lens element
59 mirror
100 region
102 optical element
104 optical system
113 surface
124, 125 surface
202 optical element
204 optical system
302 optical element
304 optical system
402 optical element
404 optical system
502 optical element
602 optical element
702 optical element
802 optical element
A optical axis
B magnetic field
BE image plane
C1, C2 control signal
CT control signal
E electric field strength
f groove width
j current density
J1-J6 current
L projection light
MW microwave radiation
OE object plane
P1, P2, P3 pupil plane
q heat flow
R1, R2 direction of movement
S sensor signal
W heat
Z1, Z2 intermediate image plane

The invention claimed is:

1. An arrangement, comprising:
   an optical element;
   a coating supported by the optical element, the coating comprising an electrically conductive material selected from the group consisting of graphene, chromium and molybdenum sulfide; and
   a mechanism configured to couple energy into the electrically conductive material during use of the arrangement so that the electrically conductive material converts coupled-in energy into thermal energy,
   wherein:
      the arrangement is a lithographic projection arrangement configured so that, during use of the arrangement, projection light impinges on the coating entirely within a continuous region of the coating;
      the continuous region of the coating has no elements that shade the projection light during use of the arrangement; and
      at least one member selected from the group consisting of the electrically conductive material and the optical element changes an optical property depending on a temperature change.

2. The arrangement of claim 1, wherein the optical property comprises a refractive index of the at least one member.

3. The arrangement of claim 1, wherein the optical property comprises an optical path length of the at least one member.

4. The arrangement of claim 1, wherein the mechanism is arranged laterally outside the continuous region of the coating.

5. The arrangement of claim 1, wherein the optical element is arranged in proximity to a field of the arrangement.

6. The arrangement of claim 5, wherein the field is an intermediate image field of the arrangement.

7. The arrangement of claim 5, wherein the field is an object field of the arrangement.

8. The arrangement of claim 5, wherein the field is an image field of the arrangement.

9. The arrangement of claim 1, wherein the arrangement comprises a pupil, and the optical element is arranged in proximity to the pupil.

10. The arrangement of claim 1, wherein the electrically conductive material is homogeneously arranged in the continuous region of the coating on a surface of the optical element.

11. The arrangement of claim 1, wherein the electrically conductive material has a substantially linear electrical resistance.

12. The arrangement of claim 1, wherein the electrically conductive material comprises graphene.

13. The arrangement of claim 1, wherein the electrically conductive material consists essentially of single-layer graphene or multi-layered graphene.

14. The arrangement of claim 1, wherein the electrically conductive material comprises doped conductive graphene.

15. The arrangement of claim 1, wherein the coating has grooves having a smaller width than a wavelength of the projection light.

16. The arrangement of claim 1, wherein the coupled-in energy is selected from the group consisting of electrical energy, magnetic energy, electromagnetic energy and combinations thereof.

17. The arrangement of claim 1, wherein the mechanism comprises electrical contacts at an edge of the continuous region.

18. The arrangement of claim 1, wherein the mechanism comprises electrodes at an edge of the continuous region.

19. The arrangement of claim 1, wherein the mechanism comprises a coil arrangement.

20. The arrangement of claim 1, further comprising a device configured to cool the coating.

21. The arrangement of claim 1, wherein the continuous region has an area of 20 mm$^2$ to 24 mm$^2$.

22. The arrangement of claim 1, wherein the coating has a transparency of at least 80% to projection light having the wavelength of 193 nm.

23. The arrangement of claim 1, wherein the arrangement is configured so that, during use of the arrangement, heating of the electrically conductive material via the mechanism is greater than heating of the optical element by absorption of the projection light.

24. The arrangement of claim 1, wherein the optical element is a refractive element.

25. The arrangement of claim 1, wherein the optical element is a lens element.

26. The arrangement of claim 1, wherein the optical element is a reflective element.

27. The arrangement of claim 1, wherein the optical element is a mirror.

28. The arrangement of claim 1, further comprising a sensor and a control device, wherein the sensor is configured to detect imaging properties of the arrangement and/or a position of the optical element, and the control is configured to control the mechanism depending on a sensor signal generated by the sensor device.

29. The arrangement of claim 1, wherein the electrically conductive material comprises chromium.

30. The arrangement of claim 1, wherein the electrically conductive material comprises molybdenum sulfide.

31. A method, comprising:

providing the arrangement of claim 1;

coupling energy into the electrically conductive material so that a resulting temperature distribution of the coating changes an optical property of the optical element to at least partially compensate for alterations of imaging properties of the arrangement induced by radiation light.

32. The arrangement of claim 1, wherein the coating is circular and has a radius between 40 mm and 160 mm.

33. An arrangement, comprising:

an optical element having an outer boundary defining an entire surface of the optical element;

a coating disposed on the entire surface of the optical element, the coating comprising an electrically conductive material selected from the group consisting of graphene, chromium and molybdenum sulfide; and a mechanism configured to couple energy into the electrically conductive material during use of the arrangement so that the electrically conductive material converts coupled-in energy into thermal energy, wherein the arrangement is a lithographic projection arrangement, the coating includes a continuous region having no elements that shade projection light during use of the arrangement, and at least one member selected from the group consisting of the electrically conductive material and the optical element changes an optical property depending on a temperature change.

* * * * *